(12) United States Patent
Shaw et al.

(10) Patent No.: US 9,421,738 B2
(45) Date of Patent: Aug. 23, 2016

(54) CHEMICALLY STABLE VISIBLE LIGHT PHOTOEMISSION ELECTRON SOURCE

(71) Applicants: Jonathan L. Shaw, Springfield, VA (US); Jeremy Hanna, Fairfax, VA (US)

(72) Inventors: Jonathan L. Shaw, Springfield, VA (US); Jeremy Hanna, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/306,122

(22) Filed: Jun. 16, 2014

(65) Prior Publication Data

US 2015/0041674 A1 Feb. 12, 2015

Related U.S. Application Data

(60) Provisional application No. 61/864,854, filed on Aug. 12, 2013.

(51) Int. Cl.

| *H01J 27/24* | (2006.01) |
| *H01J 27/26* | (2006.01) |
| *B32B 9/00* | (2006.01) |
| *B32B 9/04* | (2006.01) |

(Continued)

(52) U.S. Cl.
CPC ............... *B32B 9/007* (2013.01); *B32B 9/041* (2013.01); *B32B 15/043* (2013.01); *B32B 37/12* (2013.01); *B32B 37/24* (2013.01); *B32B 38/0036* (2013.01); *B32B 38/1858* (2013.01); *H01J 1/34* (2013.01); *B32B 2037/246* (2013.01); *B32B 2038/0052* (2013.01); *B32B 2250/05* (2013.01); *B32B 2309/68* (2013.01); *B32B 2311/00* (2013.01); *B32B 2311/09* (2013.01); *B32B 2311/16* (2013.01); *B32B 2313/04* (2013.01); *Y10T 428/12542* (2015.01)

(58) Field of Classification Search
USPC .............. 250/361 R, 362, 363.01, 365, 423 P, 250/458.1, 459.1, 461.1, 526; 257/10, 13, 257/76, 77, 79; 313/311, 346, 358
See application file for complete search history.

(56) References Cited

U.S. PATENT DOCUMENTS

| 3,745,358 A | * | 7/1973 | Firtz et al. ..................... 250/365 |
| 4,822,466 A | * | 4/1989 | Rabalais ................. C30B 23/02 204/192.15 |

(Continued)

FOREIGN PATENT DOCUMENTS

WO 2012154833 11/2012

OTHER PUBLICATIONS

Wang et al. (2011), BNL-2011: "Progress on Diamond Amplified Photocathode", [hydrogenation_atomic_H.pdf], <http://www.bnl.gov/isd/documents/75166.pdf>.*

(Continued)

*Primary Examiner* — Bernard Souw
(74) *Attorney, Agent, or Firm* — US Naval Research Laboratory; Stephen T. Humnius

(57) ABSTRACT

A method of producing electrons via photoemission comprising providing diamond doped p-type with boron, treating a surface of the diamond by exposing it to atomic hydrogen inside an ultrahigh vacuum chamber, illuminating the surface with photons, and extracting the photoemitted electrons. A chemically stable visible light photoemission electron source comprising a diamond film having a surface terminated with hydrogen and a light source.

14 Claims, 2 Drawing Sheets

(51) Int. Cl.

| | | |
|---|---|---|
| *B32B 15/04* | (2006.01) | |
| *B32B 37/12* | (2006.01) | |
| *B32B 37/24* | (2006.01) | |
| *B32B 38/00* | (2006.01) | |
| *B32B 38/18* | (2006.01) | |
| *H01J 1/34* | (2006.01) | |

(56) References Cited

U.S. PATENT DOCUMENTS

| | | | | |
|---|---|---|---|---|
| 5,334,855 | A * | 8/1994 | Moyer et al. | 257/13 |
| 5,387,795 | A * | 2/1995 | Kuzay | G01T 1/29 250/336.1 |
| 5,404,014 | A * | 4/1995 | Shu et al. | 250/336.1 |
| 5,512,873 | A * | 4/1996 | Saito | H01C 7/028 257/77 |
| 5,541,423 | A * | 7/1996 | Hirabayashi | 257/77 |
| 5,601,966 | A * | 2/1997 | Kumar | H01J 9/025 204/192.15 |
| 5,612,712 | A * | 3/1997 | Kumar | G09G 3/22 313/495 |
| 5,614,353 | A * | 3/1997 | Kumar | H01J 9/025 216/11 |
| 5,652,083 | A * | 7/1997 | Kumar | H01J 9/025 204/192.15 |
| 5,675,216 | A * | 10/1997 | Kumar | H01J 1/304 313/491 |
| 5,686,791 | A * | 11/1997 | Kumar | H01J 1/304 313/310 |
| 5,717,214 | A * | 2/1998 | Kitamura | G01T 1/29 250/336.1 |
| 5,776,323 | A * | 7/1998 | Kobashi | 204/294 |
| 5,844,252 | A * | 12/1998 | Shiomi | H01J 1/3042 257/10 |
| 5,981,866 | A * | 11/1999 | Edelson | H01J 40/16 136/256 |
| 6,008,502 | A * | 12/1999 | Deguchi | B82Y 10/00 257/10 |
| 6,064,137 | A * | 5/2000 | Cox | 310/306 |
| 6,433,474 | B1 | 8/2002 | Horiuchi et al. | 313/499 |
| 6,538,368 | B1 * | 3/2003 | Fox | H01J 1/308 257/10 |
| 6,629,869 | B1 * | 10/2003 | Kumar | G09G 3/22 445/24 |
| 6,759,800 | B1 | 7/2004 | Fernandez et al. | |
| 8,227,985 | B2 * | 7/2012 | Shurter | H01J 1/304 313/103 R |
| 8,986,532 | B2 * | 3/2015 | Hamers | C01B 21/1409 204/157.46 |
| 2003/0178583 | A1 * | 9/2003 | Kampherbeek | B82Y 10/00 250/492.3 |
| 2004/0119391 | A1 | 6/2004 | Yaniv et al. | |
| 2005/0168122 | A1 * | 8/2005 | Dahl et al. | 313/311 |
| 2006/0244352 | A1 * | 11/2006 | Tatsumi | H01J 1/304 313/311 |
| 2007/0218564 | A1 * | 9/2007 | Bachmann | H01J 49/0418 436/174 |
| 2008/0031557 | A1 * | 2/2008 | Yamanaka et al. | 384/463 |
| 2011/0156057 | A1 * | 6/2011 | Mazellier et al. | 257/77 |
| 2012/0032576 | A1 * | 2/2012 | Shurter | H01J 1/304 313/310 |
| 2012/0244281 | A1 * | 9/2012 | Fox et al. | 427/250 |
| 2013/0192977 | A1 * | 8/2013 | Hamers | C01B 21/1409 204/157.46 |
| 2013/0336873 | A1 * | 12/2013 | Ishiwata | C30B 25/18 423/446 |
| 2014/0306535 | A1 * | 10/2014 | Hamano | 307/52 |
| 2015/0044497 | A1 * | 2/2015 | Shaw | B32B 9/007 428/622 |

OTHER PUBLICATIONS

Nemanich et al. in Physica B 185 (1993) 528-538 : "Properties of Interfaces of Diamond", [hydrogenation_molecular_H2.pdf].*
Cui et al., "Photoelectron emission characteristics of diamond near the band gap", Diamond and Related Materials 9 (2000) 1036-1040, [photoemission_T.pdf].*
Clark et al. (1964) in NSM Archive—Diamond (C)—Band structure and carrier concentration, pp. 1-3; <http://www.ioffe.rssi.ru/SVA/NSM/Semicond/Diamond/bandstr.html>.*
Piantanida et al. (2000), "The effect of moderate heating on the negative electron affinity and photoyield of air-exposed H-terminated CVD diamond," WIS/25/00-Dec-DPP; <http://webhome.weizmann.ac.il/home/detlab/preprints/DIA2.pdf>.*
Tatsumi et al. "Fabrication of Highly Uniform Diamond Electron Emitter Devices," SEI Technical Review No. 64 Apr. 2007, pp. 15-20, <http://global-sei.com/tr/pdf/electronics/64-03.pdf>.*
C. Bandis & B. B. Pate, "Simultaneous field emission and photoemission from diamond," Applied Physics Letters 69, 366 (1996).*
Scienta-Omicron, 2015, EFM-H, http://www.scientaomicron.com/products/efm-h-/instrument-concept/321.*
J. H. Lay, K.M. O'Donnell, P.W. May, "Workfunction variation across surface of an H-terminated diamond film measured using Kelvin probe force microscopy," http://dx.doi.org/10.1016/j.cplett.2011.09.023.*
Shaw, J. L., et al. "Development of a diamond transmitted secondary electron source." Vacuum Nanoelectronics Conference (IVNC), 2012 25th International. IEEE, 2012.
Shaw, J. L., et al. "Images of electron transmission through thin diamond films." Vacuum Nanoelectronics Conference (IVNC), 2011 24th International. IEEE, 2011.
Shaw, Jonathan L., et al. "Diamond bonding and metallization for electron transmission cathodes." Vacuum Electron Sources Conference (IVESC), 2012 IEEE Ninth International. IEEE, 2012.
Shaw, J. L., et al. "9.3: Sub-bandgap photoemission correlated with adsorbed molecules and bulk impurities in diamond." Vacuum Nanoelectronics Conference (IVNC), 2010 23rd International. IEEE, 2010.
Sun, Tianyin, et al. "Combined visible light photo-emission and low temperature thermionic emission from nitrogen doped diamond films." Applied Physics Letters 99.20 (2011): 202101.
Sun, Tianyin, et al. "Interface and interlayer barrier effects on photo-induced electron emission from low work function diamond films." Diamond and Related Materials 44 (2014): 123-128.
Yater, Joan E., et al. "Development of biased diamond current amplifier." Vacuum Electron Sources Conference (IVESC), 2012 IEEE Ninth International. IEEE, 2012.

* cited by examiner

CHEMICALLY STABLE VISIBLE LIGHT PHOTOEMISSION ELECTRON SOURCE

This application claims priority to and the benefits of U.S. Patent Application No. 61/864,854 filed on Aug. 12, 2013, the entirety of which is herein incorporated by reference.

BACKGROUND

Electrons bound inside a solid can be promoted to vacuum by one or a combination of three major techniques: thermionic emission, field emission, or photoemission. Each method has advantages and disadvantages.

The most common method is thermionic emission, a process that requires heating the cathode (electron-emitting) material to high temperatures. The high temperature creates a fundamental limit on the lifetime of the cathode.

Field emission can occur at low temperatures, but the need to create a very high electric field at the emission site and issues associated with the high electric field limit the application of field emission sources.

The third major method of producing vacuum electrons is photoemission. Advantages of photoemission include the ability to control the time and location of the emission by changing the time and location of the incident light. For example, photoemission is often used to produce electron pulses too short to be produced by other means, typically less than about 1 nS. At normal intensities the energy of the illuminating photons hv must exceed the minimum required energy $E_{min}$ to remove electrons from the emitting material. For a metallic surface, $E_{min}$ is the work function of the surface. The range of energies produced is hv-$E_{min}$. Normally it is necessary to make hv significantly larger than $E_{min}$, since the value of $E_{min}$ varies with location across the surface and with the chemical condition of the surface.

Chemically stable metals typically have $E_{min}$ near or above 4.5 eV, so hv must be greater than 4.5 eV, which is in the ultraviolet. Typically ultraviolet light sources are more expensive and more difficult to work with than visible sources. The energy $E_{min}$ can be reduced by coating some surfaces with special materials such as alkali metals and their oxides or salts (such as Cs, CsO, or CsI). However, these materials are chemically reactive, making then difficult to work with and limiting the useful lifetime of photo-cathodes that use such coatings.

Many devices require electron beams that can be collimated or focused to a small spot. These qualities are limited by the size of the electron source and the kinetic energy transverse to the beam direction produced by the electron source. The product of the source size and transverse energy is proportional to the emittance. Equal emittance, and thus equal beam quality, can be achieved by trading off emission area and transverse energy.

Diamond surfaces terminated with hydrogen have negative electron affinity (NEA), such that electrons with energies at or above the conduction band minimum can be emitted to vacuum without gaining additional energy. This property allows efficient electron emission for electrons in the conduction band when those electrons encounter the NEA surface. The fraction of electrons that encounter the surface is enhanced or diminished by negative or positive electric field in the diamond between the electron and the surface.

Promoting an electron from the diamond valence band directly to the conduction band requires adding at least slightly more than the band gap energy (5.5 eV) to the electron, requiring light with wavelength λ<220 nm. Light with energy less than 5.5 eV can also promote electrons to the conduction band via less efficient two-step or multi-step processes involving energy states in the bandgap caused by crystal lattice imperfections such as impurity atoms or carbon vacancies. This absorption rapidly becomes weaker with longer wavelength, such that the ratio of emitted electrons to incident photons (the quantum efficiency or QE) becomes lower for longer wavelengths. Most reported measurements of photoemission from diamond showed undetectable emission current for light wavelengths λ>275 nm. One report showed a detectable emission threshold near 3.0 eV (413 nm), however no repeatable process was described to produce the low energy emission.

BRIEF SUMMARY OF THE INVENTION

We disclose an apparatus and method for producing electrons via photoemission using relatively low energy (blue-violet) photons available from inexpensive light sources such as laser diodes, without applying chemically reactive materials such as Cs or Ba to the emission surface.

In particular we have used a laser diode producing wavelengths near 405 nm. Such lasers are physically small, easy to operate, and are available commercially at low cost with optical output power up to about 1 Watt.

DETAILED DESCRIPTION

Figure 1:
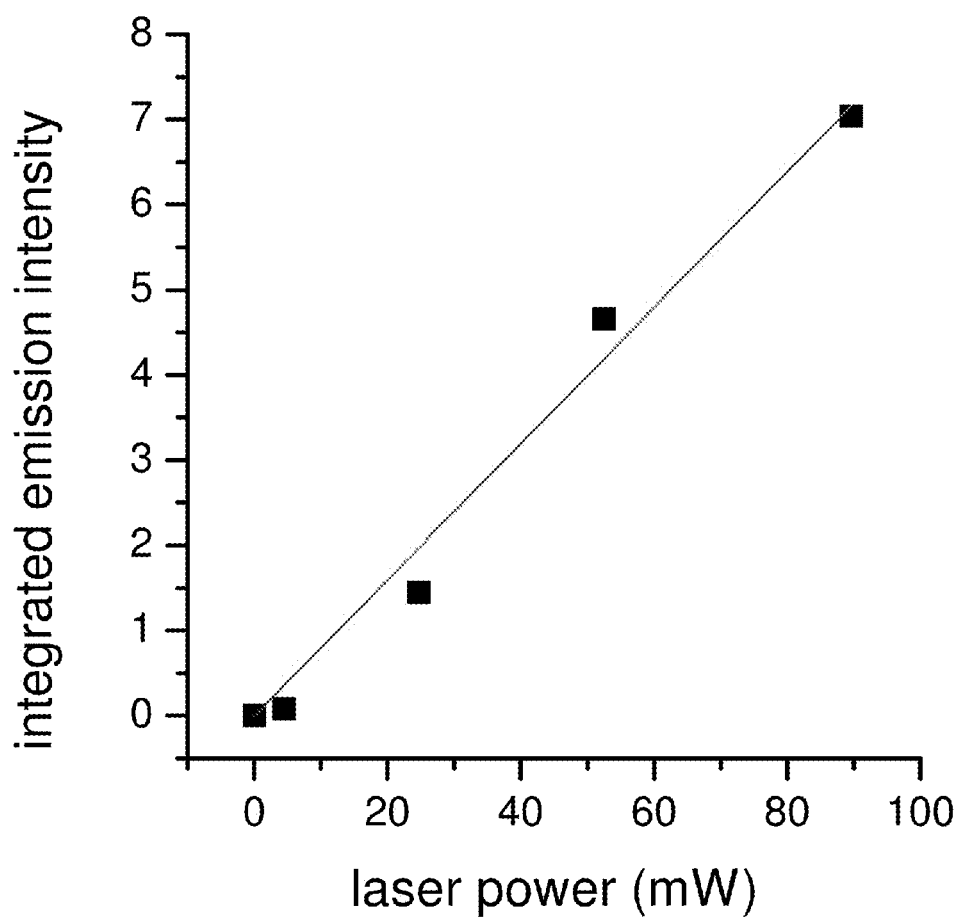
FIG. 1 illustrates the integrated emission intensity in the emission spectra of one polycrystalline diamond film as a function of 405nm laser power.

Here we disclose an apparatus and method for producing electrons via photoemission using relatively low energy (blue-violet) photons available from inexpensive light sources such as laser diodes, without applying chemically reactive materials such as Cs or Ba to the emission surface. In particular we have used a laser diode producing wavelengths near 405 nm. Such lasers are physically small, easy to operate, and are available commercially at low cost with optical output power up to about 1 Watt.

This invention concerns an apparatus and method to produce vacuum electrons.

The vacuum electrons are produced via photoemission, to provide emission from a specific area and time corresponding to the location and time of the illumination intensity, and to allow a rapid change in the emission current and/or the emission location.

The vacuum electrons are produced using readily available light sources with high power and low cost, especially sources that might be easily packaged with the photoemitter and which can be used to produce time- or location-modulated intensity.

The method and apparatus use light wavelengths which are transmitted by common optical materials such as BK7 glass and some polymers, from a chemically stable (not chemically reactive) surface, and with a narrow range of energy.

This invention produces vacuum electrons from a solid, inert surface thermally, mechanically, and chemically compatible with micro-fabricated electrodes and structures made from metallic, semiconducting, or dielectric materials. Such structures can be used to shape the emitting area, and/or control the current, energy, and trajectory of the emitted electrons.

This invention produces vacuum electrons by illuminating from the side opposite the emitting surface, such that the light source and focusing elements can be placed close to the electron emitting surface without blocking or deflecting the emitted electrons.

This invention has many applications, including scanning electron microscopes and electron beam patterning machines.

Example 1

We have hydrogenated several p-type diamond samples including specimens grown in our laboratory and a purchased specimen. Specimens that were hydrogenated by ex-situ exposure to hydrogen plasma exhibited emission threshold energies below the conduction band minimum, but did not produce photo-emission using 405 nm light. The diamonds we tested were doped with boron at levels near $1\text{-}5\times10^{16}\,cm^{-3}$ and were conductive enough to prevent significant changes in surface potential during the emission measurements. The diamond we used was grown by plasma CVD on silicon substrates and on diamond substrates. Similar diamond may be grown on other substrates. We removed one of the diamond films from its substrate and bonded it over a hole in a separate substrate (such that a portion of the film was suspended).

The diamond surface is treated by exposing it to atomic hydrogen inside an ultrahigh vacuum (UHV) chamber. We produced atomic hydrogen by passing molecular hydrogen through a commercial thermal hydrogen cracker (in our case Omicron EFM-H) consisting of a tungsten capillary tube heated to ~1800° C. with an electron beam. Operating this type of hydrogen cracker requires the chamber pressure to be less than $10^{-4}$ torr. Treating the diamond with lower flow rates of atomic hydrogen is also effective. The cracker is operated in a stainless steel UHV chamber evacuated with a turbomolecular pump. The molecular hydrogen is first purified by passing it through a commercial Pd diffusion purifier. The line connecting the purifier to the cracker is fitted with a tee leading to a second turbo pump, such that most of the purified hydrogen is pumped away before passing through the cracker. This bypass constantly flushes the gas line such that impurities introduced by the stainless steel gas line do not accumulate. Before the diamond is treated, the chamber walls are cleaned by heating while operating the atomic hydrogen source for several hours, until the partial pressures of water and hydrocarbon vapors fall below $10^{-8}$ torr. After the cleaning process is over and the chamber has cooled, gases other than hydrogen have partial pressures well below $1\times10^{-10}$ torr.

The required dose of atomic hydrogen depends on the initial condition of the diamond surface; cleaner diamond surfaces are activated more quickly. Typical surfaces may require hydrogen does similar to ~$10^6$ monolayers or 3 hours at $10^{-4}$ torr. The dose may be reduced by heating the diamond in the vacuum prior to hydrogen exposure or during hydrogen exposure. After exposing the diamond surface to sufficient dose of atomic hydrogen, photoemission occurs upon illuminating the surface with light having wavelength similar to or less than 405 nm. We have observed emission threshold energies as low as 2.6 eV (476 nm). Progress may be tested by repeatedly dosing with atomic hydrogen and testing the emisison, or by testing the emission while exposing to atomic hydrogen.

To extract the photoemitted electrons, we put the sample at negative potential with respect to the grounded chamber, thus creating a positive electric field in front of the diamond surface. We use an electric field of about $10^4$ V/m, produced with a negative potential of $-100\text{-}200\text{V}$, limited by our equipment. The emission current we measure increases with the voltage difference between the diamond and collecting electrode, suggesting that a substantially larger electric field would produce higher emission current.

The integrated emission intensity in the emission spectra of one polycrystalline diamond film is plotted in FIG. 1 as a function of 405 nm laser power. The plot shows a linear behavior, indicating that additional laser power would produce proportionally more current.

Figure 2:
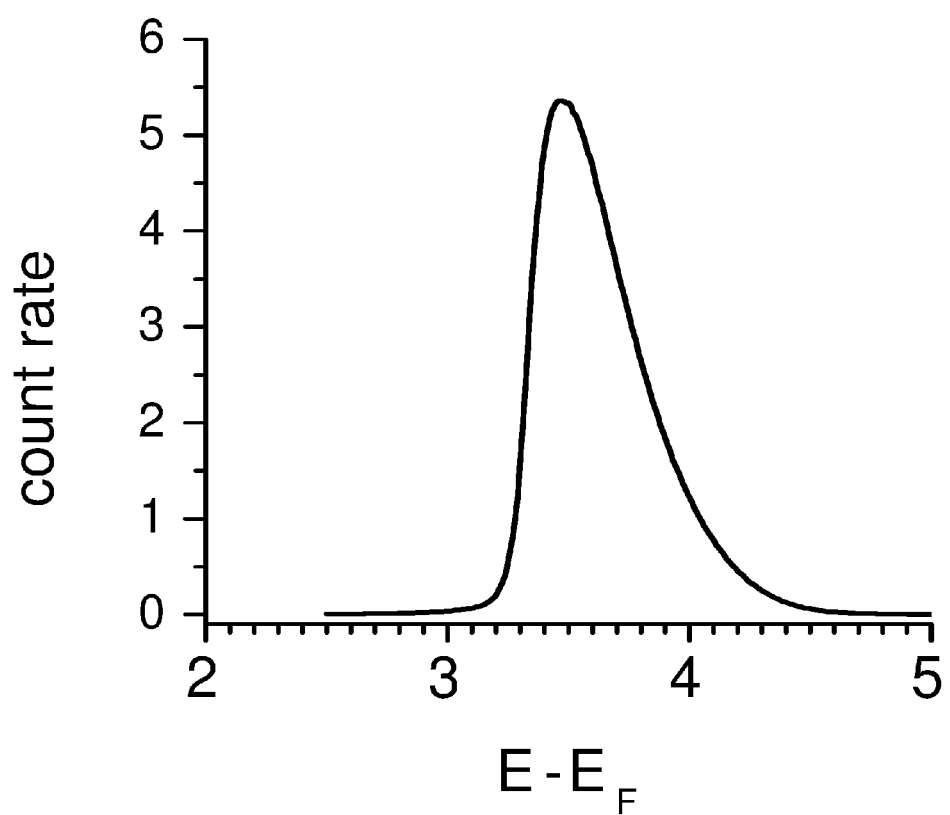
FIG. 2 illustrates an energy distribution of the electrons emitted from diamond using 405nm light.

An energy distribution of the electrons emitted from diamond using 405 nm light is plotted in FIG. 2. The full width at half maximum (FWHM) is about 0.5 eV. In some cases the energy distributions were as little as 0.2 eV.

We have verified that shorter wavelength light will also produce electrons; specifically we have tested 375, 365 and 256 nm light. The quantum efficiency increases substantially at shorter wavelengths. The maximum energy of the emitted electrons and the width of the energy distribution also increases when shorter wavelengths are used.

The quantum efficiency (QE) of the source (emitted electrons per incident photon) was approximately $10^{-7}$ under un-optimized conditions with a 45° incidence angle. The QE varied with H treatment, from place to place on a given sample, and from sample to sample, indicating the QE can be improved by optimizing the sample surface. The QE was highest immediately after H exposure and declined with time after hydrogen exposure, but was typically very stable under UHV conditions.

Example 2

One sample was treated with atomic hydrogen, then removed from the chamber and stored a box purged with nitrogen for several weeks. The sample began to emit immediately after re-inserting into the UHV chamber and baking at 250° C.

Our invention involves diamond, which is chemically inert. Furthermore, the hydrogenated surface is stable in air. The surface can be stored for long periods.

Still furthermore, diamond has exceptionally high thermal conductivity, such that high light intensities can be applied to the surface.

The hydrogenated diamond surface and the emission temperature is compatible with structures such as electrodes, which can be applied or micro-fabricated onto the diamond. Such structures can be used to control the emitting area(s), current, energy, and trajectory of the emitted electrons. For example, an image could be generated in this way and changed over time.

Our invention involves visible light with wavelength less than about 400 nm, which involves several important aspects.

Visible light has high transmission through high quality p-type diamond, such that the illumination can be applied from the side of a diamond film opposite the emission side. This allows the light source and/or a lens to be placed much closer to the emission surface than could be done from the front side and is therefore advantageous over the prior art.

Light emitting diodes and laser diodes producing wavelengths near 405, and 375 nm are easily obtained at low cost.

405 nm light has high transmission through common dielectric materials such as glass and some plastics. Thus, these materials can be used as windows and lenses.

There is a tradeoff between optical power that can be conveniently generated using available technology at various wavelengths and electron emission efficiency. Light emitting diodes and lasers providing wavelengths shorter than 405 nm should provide superior quantum efficiency with similar energy spread. At present the shortest wavelength laser diode available with substantial power produces 375 nm light. Alternatives include doubled or tripled lasers such as a tripled YAG laser which producs about 354 nm. Plasma sources such as Hg arc lamps (which produce a strong line at 254 nm) are also effective.

Light emitting diodes and lasers providing wavelengths longer than 405 nm (445-450 nm) are available commercially and provide higher power at lower cost than the shorter wavelength sources.

In some applications it may be advantageous to illuminate the diamond photocathode from the side opposite to the emission side. This can be readily accomplished since diamond is largely transparent to the sub-bandgap light. The diamond should have the shape of a thin film or plate, optically smooth on both sides, and should be mounted in a way that leaves both sides of the plate exposed. It is possible to grow poly-crystal diamond over an optically transparent substrate, such that the diamond need not be mounted.

Some applications may require emission from a small area or high resolution image. This can be readily accomplished by focusing the light onto the emission surface of the diamond from the back side. A lens placed on the emission side of the diamond would typically require a long focal length lens to avoid interfering with the electron trajectory. Positioning the lens immediately behind the diamond plate allows a much shorter focal length lens and axial alignment. Area resolution of approximately 1 micron can be produced in this way. Since passing the light through thicker diamond films (especially poly-crystalline films) will tend to diffuse and de-focus the light, obtaining the smallest possible focal spot can involve a thin film of single crystal diamond.

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What we claim is:

1. A method of producing electrons via photoemission comprising:
   providing diamond doped p-type with boron;
   wherein the diamond does not comprise grain boundaries;
   wherein the diamond is electrically connected to a ground or voltage source;
   treating a surface of the diamond inside an ultrahigh vacuum chamber by exposing it to an atomic hydrogen source comprised of a tungsten tube heated to at least 1800° C. with molecular hydrogen passing through it;
   illuminating the surface with photons from light having a wavelength similar to 405 nm;
   extracting the photoemitted electrons; and
   verifying the low energy photoemission by monitoring the photoelectron current produced by illuminating the diamond surface with a light source;
   wherein the diamond doped p-type with boron results in the diamond being conductive, and wherein the tungsten tube is oriented with the tube axis aimed at the diamond surface and a short distance from the diamond surface to cause the low energy photoemission.

2. The method of producing electrons via photoemission of claim 1 wherein the diamond does not contain nitrogen.

3. The method of producing electrons via photoemission of claim 1 wherein the diamond is transparent to the light used to excite photoemission.

4. The method of producing electrons via photoemission of claim 1 wherein the atomic hydrogen exposure is performed inside the same vacuum chamber as photoemission, and can be performed repeatedly before, during, or after the photoemission.

5. A chemically stable visible light photoemission electron source comprising:
   a diamond film having a surface terminated with hydrogen;
   wherein the diamond film may or may not comprise grain boundaries; and
   a light source having a wavelength of from about 475 nm to about 250 nm
   wherein electrons are generated at the surface of the diamond and photoemitted and
   wherein the electrons move directly from the surface into a vacuum without first being excited into the conduction band.

6. The chemically stable visible light photoemission electron source of claim 5 wherein the diamond film has a top surface and a bottom surface, wherein the top surface is exposed to an atomic hydrogen source in a UHV chamber and wherein the light source is located near, or the light is directed to, the bottom surface such that the illumination travels through the diamond.

7. The chemically stable visible light photoemission electron source of claim 5 wherein the light source has a wavelength of about 405 nm or less.

8. The chemically stable visible light photoemission electron source of claim 5 wherein the light source has a wavelength of 475 nm or less or is one selected from the group of common laser wavelengths including 473 nm, 450 nm, 445 nm, 405 nm, 375 nm and 354 nm.

9. The chemically stable visible light photoemission electron source of claim 5 wherein the temperature of the diamond film is increased in order to improve the quantum efficiency of emission.

10. The chemically stable visible light photoemission electron source of claim 5 wherein the temperature of the diamond film is changed in order to change the lowest energy of emitted electrons according to the change in the diamond band gap energy.

11. The chemically stable visible light photoemission electron source of claim 5 wherein the temperature of the diamond film ranges from room temperature up to 800° C. during atomic hydrogen exposure.

12. The chemically stable visible light photoemission electron source of claim 5 wherein the diamond is exposed to hydrogen during emission in order to improve the quantum efficiency of emission.

13. The chemically stable visible light photoemission electron source of claim 5 wherein the diamond is exposed to atomic hydrogen during emission in order to improve the quantum efficiency of emission.

14. The chemically stable visible light photoemission electron source of claim 5 wherein the diamond is exposed to ultraviolet light created by atomic hydrogen instead of or in addition to other light sources in order to cause emission.

* * * * *